US012626742B2

(12) United States Patent　　(10) Patent No.:　US 12,626,742 B2
Smith et al.　　　　　　　　　　(45) Date of Patent:　　May 12, 2026

(54) SYSTEMS AND METHODS FOR ENSURING HIGH READ RELIABILITY IN PRE-PROGRAMMED MEMORY CELLS

(71) Applicant: Veevx, Inc., Mesa, AZ (US)

(72) Inventors: Doug Smith, Mesa, AZ (US); Sushil Sakhare, Mesa, AZ (US)

(73) Assignee: Veevx, Inc., Mesa, AZ (US)

( * ) Notice: Subject to any disclaimer, the term of this patent is extended or adjusted under 35 U.S.C. 154(b) by 94 days.

(21) Appl. No.: 18/453,816

(22) Filed: Aug. 22, 2023

(65) Prior Publication Data

US 2024/0062796 A1　　Feb. 22, 2024

Related U.S. Application Data

(60) Provisional application No. 63/373,153, filed on Aug. 22, 2022.

(51) Int. Cl.
G11C 11/16　　　　(2006.01)

(52) U.S. Cl.
CPC ...... G11C 11/1673 (2013.01); G11C 11/1675 (2013.01); G11C 11/1697 (2013.01)

(58) Field of Classification Search
CPC ............ G11C 11/1673; G11C 11/1675; G11C 11/1697; G11C 11/5692; G11C 11/1655; G11C 29/50; G11C 17/18; G11C 17/02; G11C 11/1659; G11C 11/5607
See application file for complete search history.

(56) References Cited

U.S. PATENT DOCUMENTS

| | | | | |
|---|---|---|---|---|
| 2016/0293268 A1* | 10/2016 | Jan | ......................... | G11C 17/18 |
| 2017/0178706 A1* | 6/2017 | Noguchi | .............. | G11C 13/003 |
| 2019/0252019 A1* | 8/2019 | Aoki | .................... | G11C 13/003 |
| 2020/0013445 A1* | 1/2020 | Tzoufras | ............. | G11C 11/1659 |
| 2022/0358982 A1* | 11/2022 | Williams | .............. | G11C 17/18 |

* cited by examiner

*Primary Examiner* — Xiaochun L Chen
(74) *Attorney, Agent, or Firm* — Polsinelli PC

(57)　　　　　ABSTRACT

To increase read reliability margins in read-only MRAM arrays, a complimentary pair of MRAM cells includes a first MRAM cell having a first resistance value within a first "high" resistance range $R_H$ and storing a logic "HI" value and a second "shorted" MRAM cell having a second resistance value within a second "minimal" resistance range $R_o$ and storing a logic "LO" value. During manufacture and testing, MRAM cells that are assigned logic "LO" values are permanently shorted prior to distribution such that they permanently exhibit resistance values within the second "minimal" resistance range $R_o$. When reading the values stored within the complimentary pair of MRAM cells, a differential sense amplifier applies a common reference current across the first MRAM cell and the second "shorted" MRAM cell; by shorting cells with logic "LO" values, a system can reliably read logic values stored within the read-only MRAM array.

14 Claims, 9 Drawing Sheets

200

210 PROVIDE A MEMORY ARRAY HAVING A PLURALITY OF MEMORY CELLS, WHERE THE PLURALITY OF MEMORY CELLS ARE TO BE CONFIGURED FOR READ-ONLY OPERATIONS

220 DETERMINE A FIRST SUBSET OF MEMORY CELLS TO BE PROGRAMMED TO PERMANENTLY EXHIBIT A FIRST LOGIC "HI" VALUE

230 DETERMINE A SECOND SUBSET OF MEMORY CELLS TO BE PROGRAMMED TO PERMANENTLY EXHIBIT A SECOND LOGIC "LO" VALUE

240 CONFIGURE EACH MEMORY CELL OF THE FIRST SUBSET OF MEMORY CELLS SUCH THAT EACH RESPECTIVE MEMORY CELL OF THE FIRST SUBSET OF MEMORY CELLS EXHIBITS A FIRST RESISTANCE VALUE WITHIN A FIRST HIGH-RESISTANCE RANGE $R_H$

250 APPLY A SHORTING VOLTAGE HAVING A VOLTAGE VALUE WITHIN A SHORTING VOLTAGE RANGE TO EACH MEMORY CELL OF THE SECOND SUBSET OF MEMORY CELLS SUCH THAT EACH RESPECTIVE MEMORY CELL OF THE SECOND SUBSET OF MEMORY CELLS EXHIBITS A SECOND RESISTANCE VALUE WITHIN A SECOND MINIMAL-RESISTANCE RANGE $R_o$

260 CONFIGURE A MULTIPLEXER OF THE MEMORY UNIT TO PAIR EACH MEMORY CELL OF THE FIRST SUBSET OF MEMORY CELLS WITH A RESPECTIVE MEMORY CELL OF THE SECOND SUBSET OF MEMORY CELLS

270 PROVIDE THE DIFFERENTIAL SENSING AMPLIFIER IN ELECTRICAL COMMUNICATION WITH THE FIRST SUBSET OF MEMORY CELLS AND THE SECOND SUBSET OF MEMORY CELLS

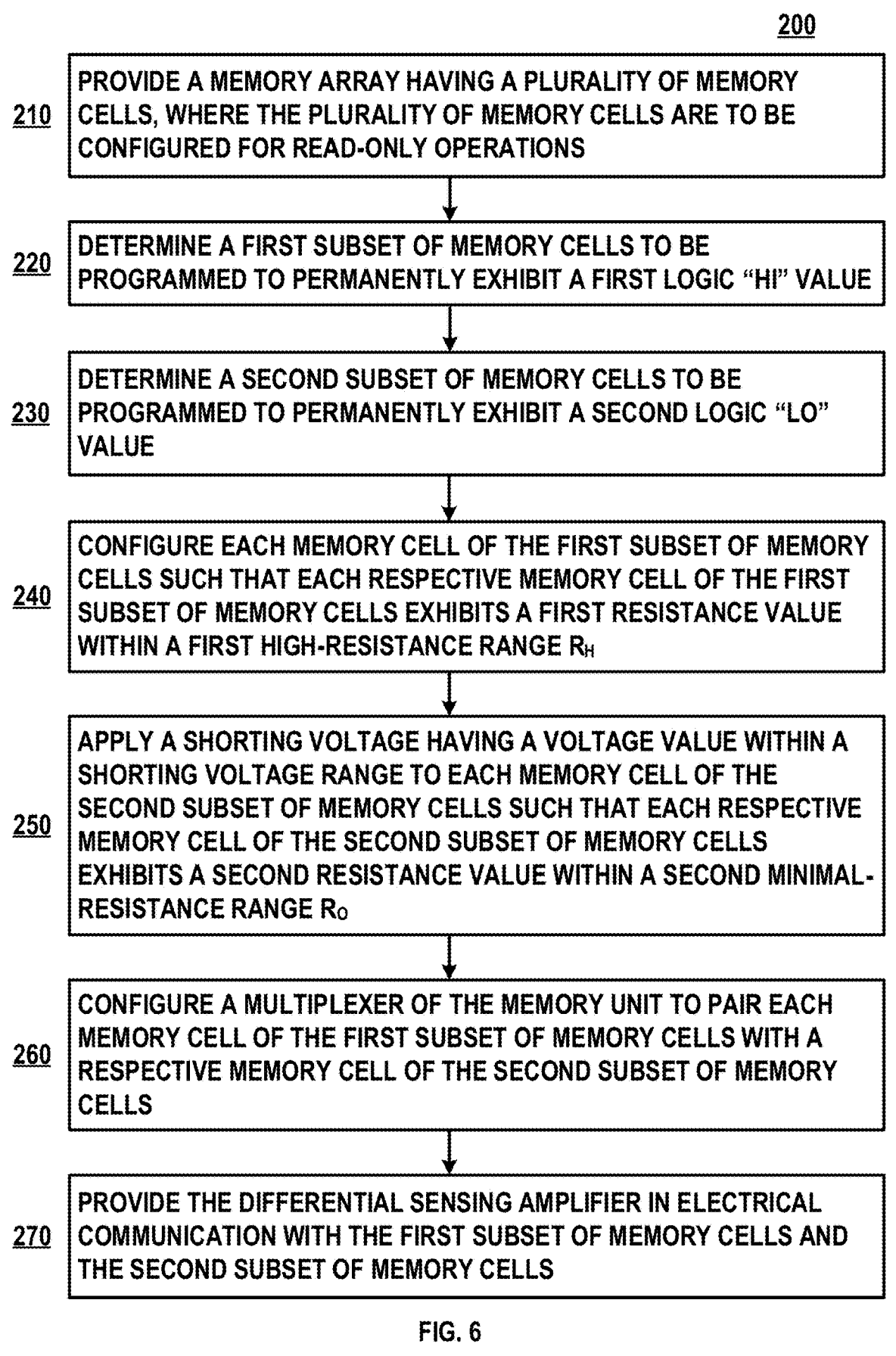

200

| 210 | PROVIDE A MEMORY ARRAY HAVING A PLURALITY OF MEMORY CELLS, WHERE THE PLURALITY OF MEMORY CELLS ARE TO BE CONFIGURED FOR READ-ONLY OPERATIONS |

| 220 | DETERMINE A FIRST SUBSET OF MEMORY CELLS TO BE PROGRAMMED TO PERMANENTLY EXHIBIT A FIRST LOGIC "HI" VALUE |

| 230 | DETERMINE A SECOND SUBSET OF MEMORY CELLS TO BE PROGRAMMED TO PERMANENTLY EXHIBIT A SECOND LOGIC "LO" VALUE |

| 240 | CONFIGURE EACH MEMORY CELL OF THE FIRST SUBSET OF MEMORY CELLS SUCH THAT EACH RESPECTIVE MEMORY CELL OF THE FIRST SUBSET OF MEMORY CELLS EXHIBITS A FIRST RESISTANCE VALUE WITHIN A FIRST HIGH-RESISTANCE RANGE $R_H$ |

| 250 | APPLY A SHORTING VOLTAGE HAVING A VOLTAGE VALUE WITHIN A SHORTING VOLTAGE RANGE TO EACH MEMORY CELL OF THE SECOND SUBSET OF MEMORY CELLS SUCH THAT EACH RESPECTIVE MEMORY CELL OF THE SECOND SUBSET OF MEMORY CELLS EXHIBITS A SECOND RESISTANCE VALUE WITHIN A SECOND MINIMAL-RESISTANCE RANGE $R_0$ |

| 260 | CONFIGURE A MULTIPLEXER OF THE MEMORY UNIT TO PAIR EACH MEMORY CELL OF THE FIRST SUBSET OF MEMORY CELLS WITH A RESPECTIVE MEMORY CELL OF THE SECOND SUBSET OF MEMORY CELLS |

| 270 | PROVIDE THE DIFFERENTIAL SENSING AMPLIFIER IN ELECTRICAL COMMUNICATION WITH THE FIRST SUBSET OF MEMORY CELLS AND THE SECOND SUBSET OF MEMORY CELLS |

FIG. 6

SYSTEMS AND METHODS FOR ENSURING HIGH READ RELIABILITY IN PRE-PROGRAMMED MEMORY CELLS

CROSS REFERENCE TO RELATED APPLICATIONS

This is a non-provisional application that claims benefit to U.S. Application Ser. No. 63/373,153 filed on Aug. 22, 2022, which is herein incorporated by reference in its entirety.

FIELD

The present disclosure generally relates to digital memory arrays, and in particular, to a system and associated method for ensuring high read reliability in magnetoresistive random access memory arrays.

BACKGROUND

Electronic devices often require pre-programmed memory arrays that are tested prior to packaging. Manufacturers determine which memory cells of a pre-programmed memory array need to be fixed at a logic "HI" (e.g., a logic "1") and which memory cells need to be fixed at a logic "LO" (e.g., a logic "0") in order to function as intended, and will fix the memory cells of the pre-programmed memory array at the intended logic values. However, electrical properties of memory cells that are intended to hold fixed values within pre-programmed memory arrays can be subject to drift in which memory cells with "HI" values and memory cells with "LO" values can become almost indiscernible from one another, preventing a system from reliably reading data values held within the pre-programmed memory arrays.

It is with these observations in mind, among others, that various aspects of the present disclosure were conceived and developed.

BRIEF DESCRIPTION OF THE DRAWINGS

FIG. 6 is a process flow diagram showing a method for configuring a memory unit as shown in FIG. 3 to ensure high read reliability.

Corresponding reference characters indicate corresponding elements among the view of the drawings. The headings used in the figures do not limit the scope of the claims.

DETAILED DESCRIPTION

Systems and associated methods for ensuring high read reliability in read-only magnetoresistive random access memory (MRAM) arrays are described herein. In particular, a memory unit includes a first memory cell having a first magnetic tunnel junction (MTJ) device that stores a first pre-programmed logic value, and a second memory cell having a second MTJ device that stores a second pre-programmed logic value and is paired with the first memory cell to enable a system to read data values stored within the first memory cell and/or the second memory cell. The first memory cell and the second memory cell are complimentary; for instance, if the first memory cell permanently stores a logic "HI" value, then the second memory cell permanently stores a logic "LO" value, and vice-versa. The second MTJ device of the second memory cell is permanently shorted to ensure that a resistance value across the second MTJ device is at a minimum resistance value, ensuring high read margins between logic values associated with the first MTJ device and the second MTJ device. The memory array can include one or more multiplexers that facilitate pairing of the first memory cell and the second memory cell to ensure that the first memory cell and the second memory cell are complimentary values. Further, the present disclosure provides an example differential sensing amplifier that performs a read operation to read logic values stored within the first MTJ device and the second MTJ device.

MTJ Devices

Figures 1A, 1B, 1C:
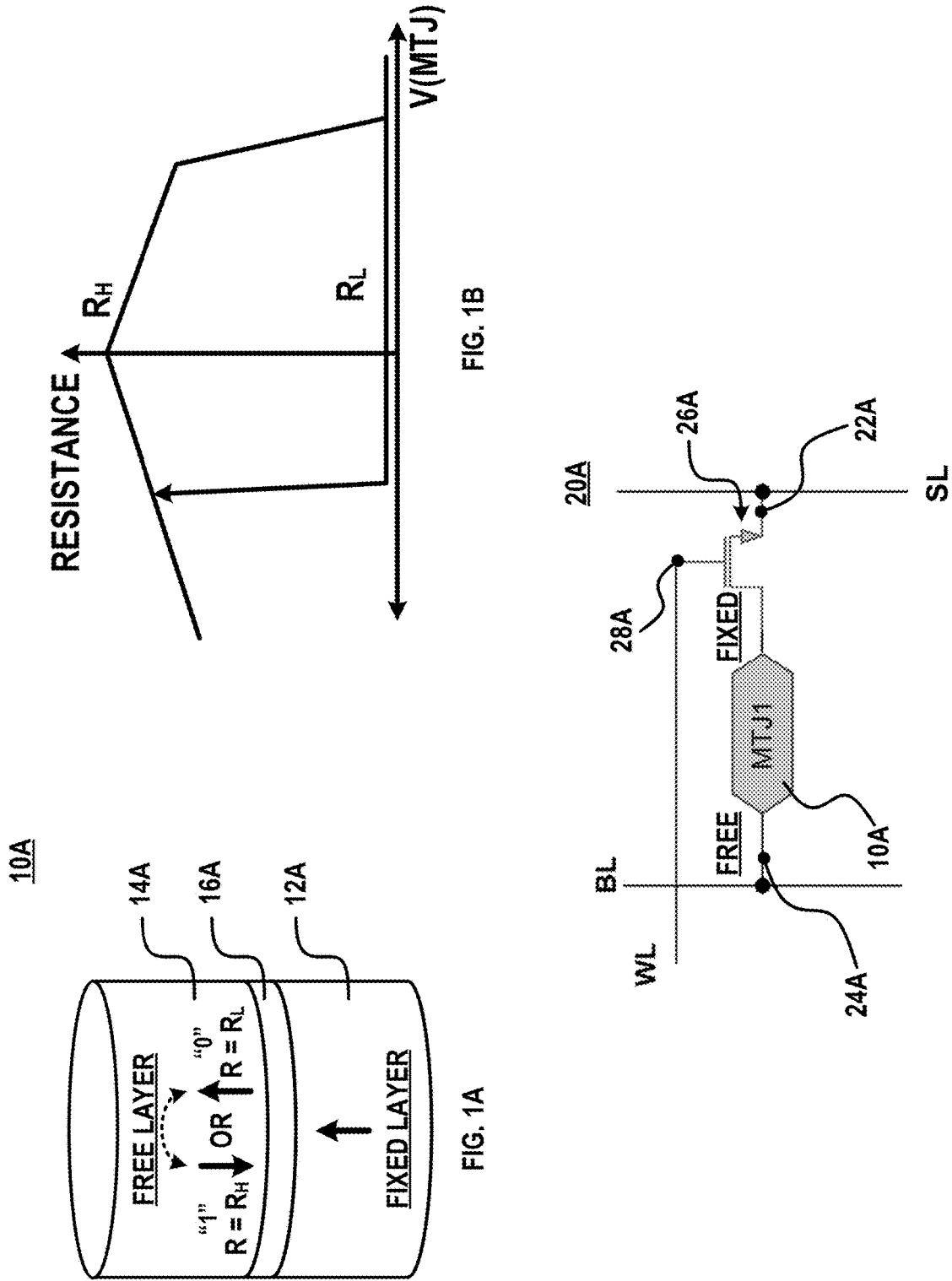
FIG. 1A is a simplified illustration showing a conventional MTJ device capable of exhibiting a first logic "HI" value or a second logic "LO" value.
FIG. 1B is a graphical representation showing a transfer curve of the MTJ device of FIG. 1A.
FIG. 1C is a schematic diagram showing a conventional MRAM cell that includes the MTJ device of FIG. 1A.

With reference to FIG. 1A, an MTJ device 10A has a fixed layer 12A having a first magnetic dipole orientation that is fixed (e.g., permanent), a free layer 14A having a second magnetic dipole orientation that is variable between a first direction (e.g., in alignment with the first magnetic dipole orientation) and a second direction (e.g., opposite from the first magnetic dipole orientation), and a barrier layer 16A therebetween. The first magnetic dipole orientation of the fixed layer 12A is always fixed along a first direction, and the second magnetic dipole orientation of the free layer 14A can vary between the first direction and a second direction, where the second direction is opposite to the first direction; the second magnetic dipole orientation of the second "free" layer dictates whether the MTJ device 10A holds a logic "HI" value (e.g., a logic "1") or a logic "LO" value (e.g., a logic "0" value). Typically, the MTJ device 10A stores a logic "HI" value by exhibiting a resistance value within a statistical distribution of "high" resistance, referred to herein as "high-resistance range $R_H$", observed between the fixed layer 12A and the free layer 14A of the MTJ device 10A such that the first magnetic dipole orientation of the fixed layer 12A and the second magnetic dipole orientation of the free layer 14A are opposite from one another. The MTJ device 10A stores a logic "LO" by exhibiting a resistance value within a statistical distribution of "low" resistance, referred to herein as "low-resistance" range $R_L$ observed between the fixed layer 12A and the free layer 14A of the MTJ device 10A such that the first magnetic dipole orientation of the fixed layer 12A and the second magnetic dipole orientation of the free layer 14A are in alignment with one another. The resistance value exhibited by the MTJ device 10A is readable by passing a reference current through the MTJ device 10A and measuring a resultant voltage value across the MTJ device 10A. A transfer curve showing variation in resistance values relative to applied voltage across the MTJ device 10A is shown in FIG. 1B. Note that even when the MTJ device 10A is storing a logic "LO" and exhibits a resistance value within a "low" resistance range $R_L$, the value of $R_L$ is a nonzero value and can vary between MTJ devices.

As shown in FIG. 1C, the MTJ device 10A can be a component of a magnetoresistive cell 20A including a first terminal 22A in electrical communication with a "source" line SL and a second terminal 24A in electrical communication with a "bit" line BL. The fixed layer 12A of the MTJ device 10A is associated with the first terminal 22A and the free layer 14A of the MTJ device 10A is associated with the second terminal 24A. The magnetoresistive cell 20A can include an access transistor 26A electrically coupled between the first terminal 22A of the magnetoresistive cell 20A and the fixed layer 12A of the MTJ device 10A; the access transistor 26A including a gate terminal 28A that is electrically coupled to a "word" line WL. To initiate a "read" operation of the MTJ device 10A, a reference current must be passed through the magnetoresistive cell 20A to measure the resistance across the MTJ device 10A. The word line WL must be activated in order to enable the access transistor 26A to transmit current between the source line SL coupled at the first terminal 22A and the bit line BL coupled at the second terminal 24A.

Possible Resistance Ranges of an MTJ

Figure 2A:
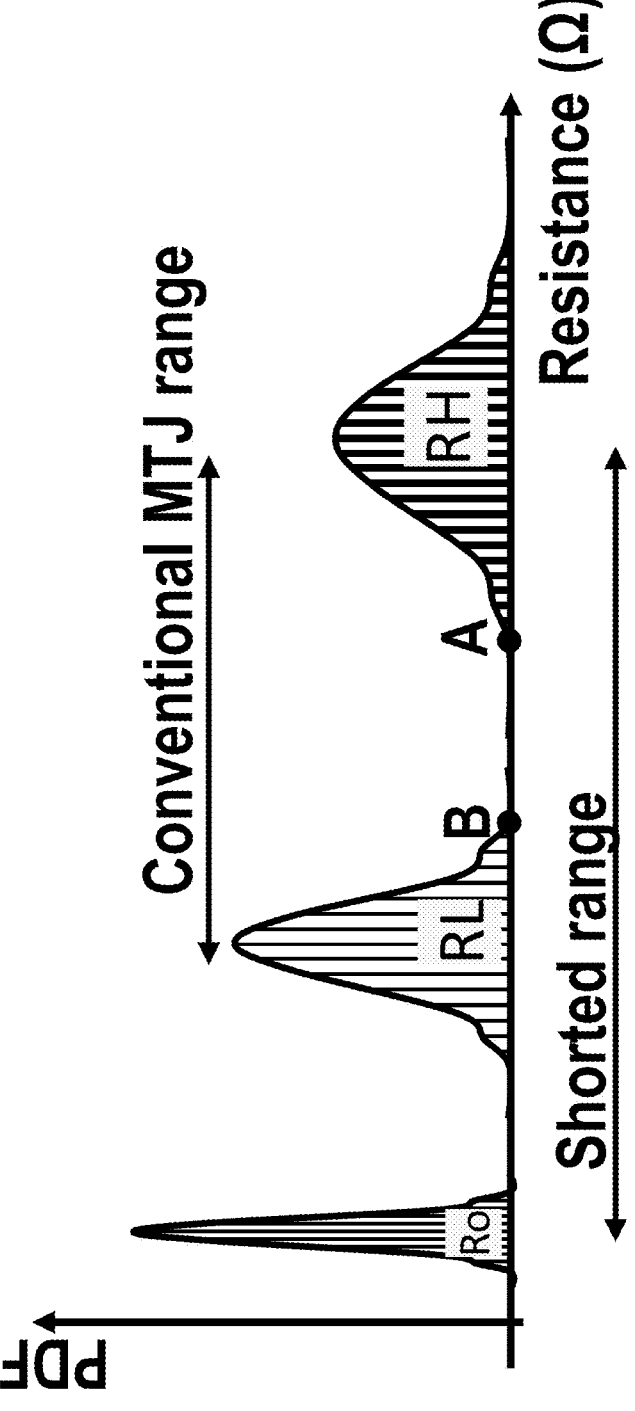
FIG. 2A is a graphical representation showing a probability density function (PDF) curve of an MTJ device including a minimal resistance range $R_o$.

With additional reference to FIG. 2A, a typical statistical distribution of "high" resistance ("high-resistance range $R_H$") and a typical statistical distribution of "low" resistance ("low-resistance range $R_L$") of an MTJ device such as MTJ device 10A are observed, however note that in extreme cases, a valid resistance value denoting a logic "LO" within the "low" resistance range $R_L$ can be very close to a valid "high" resistance value within the "high" resistance range $R_H$, making it difficult to discern whether the logic value stored by the magnetoresistive cell is a logic "HI" or a logic "LO". For example, consider a first pre-programmed magnetoresistive cell that stores a logic "HI" value but has a resistance value that is on the "lower" side of the "high" resistance value $R_H$ range (for instance, at point A of FIG. 2A), and a second pre-programmed magnetoresistive cell that is complimentary to the first pre-programmed magnetoresistive cell and stores a logic "LO" value but has a resistance value that is on the "higher" side of the "low" resistance value $R_L$ range (for instance, at point B of FIG. 2A). When a reference current is applied across the first pre-programmed magnetoresistive cell and the second pre-programmed magnetoresistive cell, a resultant first output voltage value associated with the first pre-programmed magnetoresistive cell and a resultant second output voltage value associated with the second pre-programmed magnetoresistive cell may be too close to one another to make a reliable determination of the logic value stored at the first pre-programmed magnetoresistive cell, even if the first pre-programmed magnetoresistive cell and the second pre-programmed magnetoresistive cell have complimentary logic values.

Ensuring High Read Reliability with "Shorted" MTJ Devices

Figure 2C:
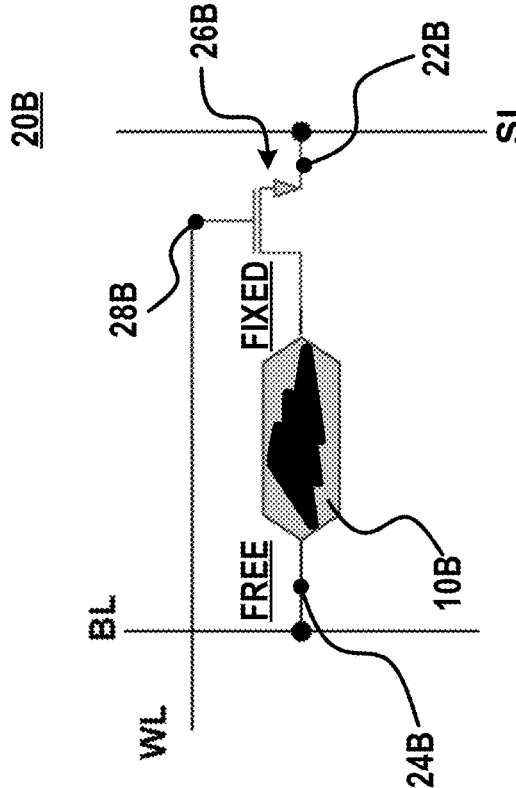
FIG. 2C is a schematic diagram showing an MRAM cell that includes the shorted MTJ device of FIG. 2B.
Figure 2B:
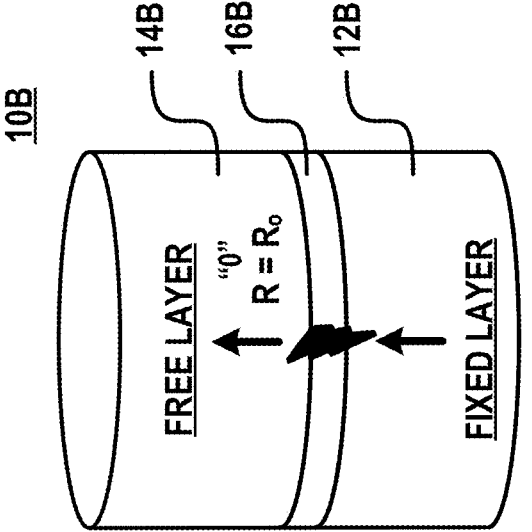
FIG. 2B is a simplified illustration showing a shorted MTJ device capable of exhibiting a second logic "LO" value and having a resistance value within the minimal resistance range $R_o$.

As such, one object of the present disclosure aims to remedy the problem of unreliable "read" operations in pre-programmed MRAM-based memory arrays. With reference to FIGS. 2A-2C, a "shorted" MTJ device 10B is shown similarly having a fixed layer 12B having a first magnetic dipole orientation that is fixed (e.g., permanent), a free layer 14B having a second magnetic dipole orientation, and a barrier layer 16B therebetween. However, application of a shorting voltage having a voltage value within a shorting voltage or current range (e.g., a very high voltage or current value) can permanently break the barrier 16B of the shorted MTJ device 10B, thereby shorting a connection between the free layer 14B and the fixed layer 12B. The shorted MTJ device 10B permanently stores a logic "LO" value, and unlike the MTJ device 10A of FIGS. 1A and 1B, the shorted MTJ device 10B has a resistance value across the shorted MTJ device 10B that is within a tight statistical distribution of "minimal" resistance ("minimal-resistance range $R_o$"), which is considerably lower than the "low" resistance range $R_L$ as shown in FIG. 2B. For a read operation, if the (un-shorted) MTJ device 10A stores a logic "HI" value (and has a resistance value within the "high" resistance range $R_H$) and is paired with the shorted MTJ device 10B (and has a resistance value within the "minimal" resistance range $R_o$), then a large voltage differential can be observed between the (un-shorted) MTJ device 10A and the shorted MTJ device 10B, increasing read reliability.

Similarly, as shown in FIG. 2C, the shorted MTJ device 10B can be a component of a magnetoresistive cell 20B including a first terminal 22B in electrical communication with a "source" line SL and a second terminal 24B in electrical communication with a "bit" line BL. The fixed layer 12B of the shorted MTJ device 10B is associated with the first terminal 22B and the free layer 14B of the shorted MTJ device 10B is associated with the second terminal 24B. The magnetoresistive cell 20B can include an access transistor 26B electrically coupled between the first terminal 22B of the magnetoresistive cell 20B and the fixed layer 12B of the shorted MTJ device 10B; the access transistor 26B including a gate terminal 28B that is electrically coupled to a "word" line WL. To initiate a "read" operation of the shorted MTJ device 10B, a reference current must be passed across the magnetoresistive cell 20B to measure the resistance across the shorted MTJ device 10B. The word line WL must be activated in order to enable the access transistor 26B to transmit current between the source line SL coupled at the first terminal 22B and the bit line BL coupled at the second terminal 24B.

Memory Unit

Figure 3:
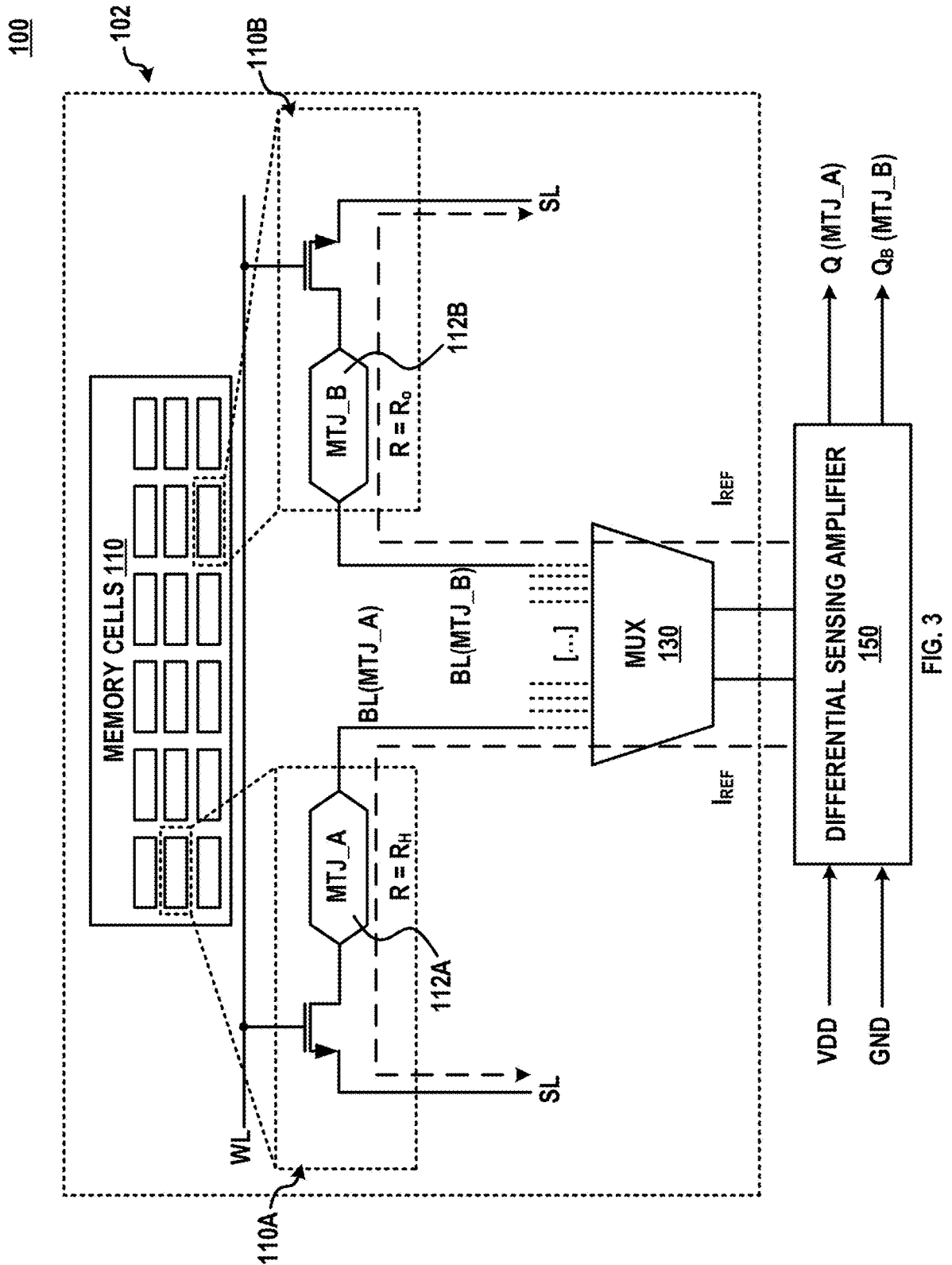
FIG. 3 is a schematic diagram showing a memory unit employing the shorted MTJ device of FIG. 2B and the MTJ device of FIG. 1A to ensure high read reliability.

With reference to FIG. 3, a memory unit 100 described herein ensures high read reliability in pre-programmed MRAM-based memory arrays. In particular, the memory unit 100 includes a memory array 102 having a plurality of memory cells 110 including a first memory cell 110A having a first MTJ device 112A that stores a first pre-programmed logic value, and a second memory cell 110B having a second MTJ device 112B that stores a second pre-programmed logic value and is paired with the first memory cell 110A. The first memory cell 110A and the second memory cell 110B should be complimentary; for instance, if the first memory cell 110A permanently stores a logic "HI" value, then the second memory cell 110B permanently stores a logic "LO" value, and vice-versa. The first memory cell 110A is configured as shown in the examples of FIGS. 1A-1C, and the second memory cell 110B that stores the logic "LO" value is shorted as shown in the examples of FIGS. 2B and 2C. The memory array 102 can include one or more multiplexers 130 that facilitate pairing of the first memory cell 110A and the second memory cell 110B to ensure that the first memory cell 110A and the second memory cell 110B are complimentary values.

To perform a "read" operation and read the logic value of the first memory cell 110A, the memory unit 100 can include a differential sensing amplifier 150 that applies a common reference current $I_{REF}$ across the first memory cell 110A and the second memory cell 110B resulting in a first output voltage value C) associated with the first memory cell 110A and a second output voltage value $Q_B$ associated with the second memory cell 110B, where the first output voltage value associated with the first memory cell 110A is indicative of the logic value stored in the first memory cell 110A and the second output voltage value $Q_B$ associated with the second memory cell 110B is indicative of the logic value stored in the second memory cell 110B.

The first memory cell 110A of the memory unit 100 can be configured to store a logic "HI" value; as such, the first resistance value of the first memory cell 110A is within a first "high" resistance value range $R_H$. However, the second memory cell 110B of the memory unit 100 is permanently shorted such that the second resistance value observed across the second memory cell 110B is within a second "minimal" resistance range $R_o$, rather than a third "low" resistance range $R_L$ commonly attributed to magnetoresistive cells that store logic "LO" values. This can be accomplished by application of a shorting voltage or current value within a range (e.g., a very high voltage or current value) across the second memory cell 110B during programming to permanently break the barrier layer 16B of the second memory cell 110B to short the second MTJ device 112B of the second memory cell 110B and force the resistance value observed between the "free" layer and the "fixed" layer of the second memory cell 110B to be within the minimal resistance range $R_o$. As such, when reading the value of the first memory cell 110A, an observed voltage differential between the first output voltage value Q across the first memory cell 110A and the second output voltage value $Q_B$ across the second memory cell 110B is maximized when the second resistance value across the second memory cell 110B is within the minimal resistance range $R_o$, ensuring a high "read" margin between the first output voltage value Q across the first memory cell 110A and the second output voltage value $Q_B$ across the second memory cell 110B.

As discussed above, when reading the logic value stored in the first memory cell 110A, the differential sensing amplifier 150 applies the common reference current across the first memory cell 110A and the second memory cell 110B resulting in the first output voltage value Q associated with the first memory cell 110A and the second output voltage value $Q_B$ associated with the second memory cell 110B, where the first output voltage value Q associated with the first memory cell 110A is indicative of the logic value stored in the first memory cell 110A and the second output voltage value $Q_B$ associated with the second memory cell 110B is indicative of the logic value stored in the second memory cell 110B. When the first resistance of the first memory cell 110A is within the first high resistance range $R_H$ (e.g., such that the first memory cell 110A stores a logic "HI") and the second resistance of the second memory cell 110B is within the second minimal resistance range $R_o$ (e.g., such that the second memory cell 110B stores a logic "LO" and has the lowest possible resistance value), the differential sensing amplifier 150 is able to sense the highest possible difference between the first output voltage value Q associated with the first memory cell 110A and the second output voltage value $Q_B$ associated with the second memory cell 110B. In particular, the differential sensing amplifier 150 measures the first output voltage value Q associated with the first memory cell 110A and the second output voltage value $Q_B$ associated with the second memory cell 110B; due to the increased margin between resistance values indicative of a logic "HI" (e.g., within the first "high" resistance value range $R_H$) and resistance values indicative of a logic "LO" (e.g., within the second "minimal" resistance range $R_o$), read reliability is substantially increased.

Read Operation with Complimentary Memory Cells

Figure 4A:
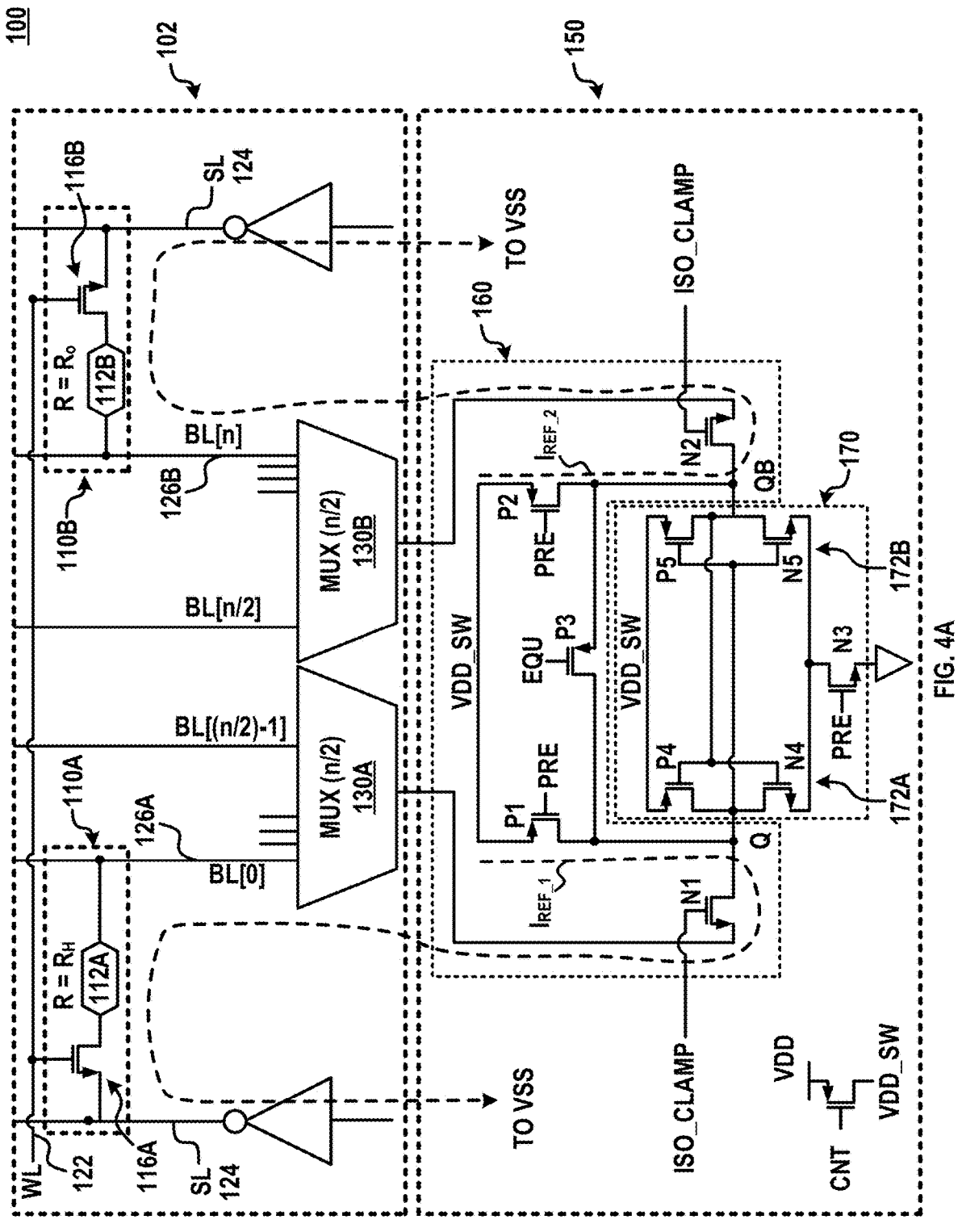
FIG. 4A is a schematic diagram showing the memory unit of FIG. 3 having a differential sensing amplifier that performs a read operation.
Figure 4B:
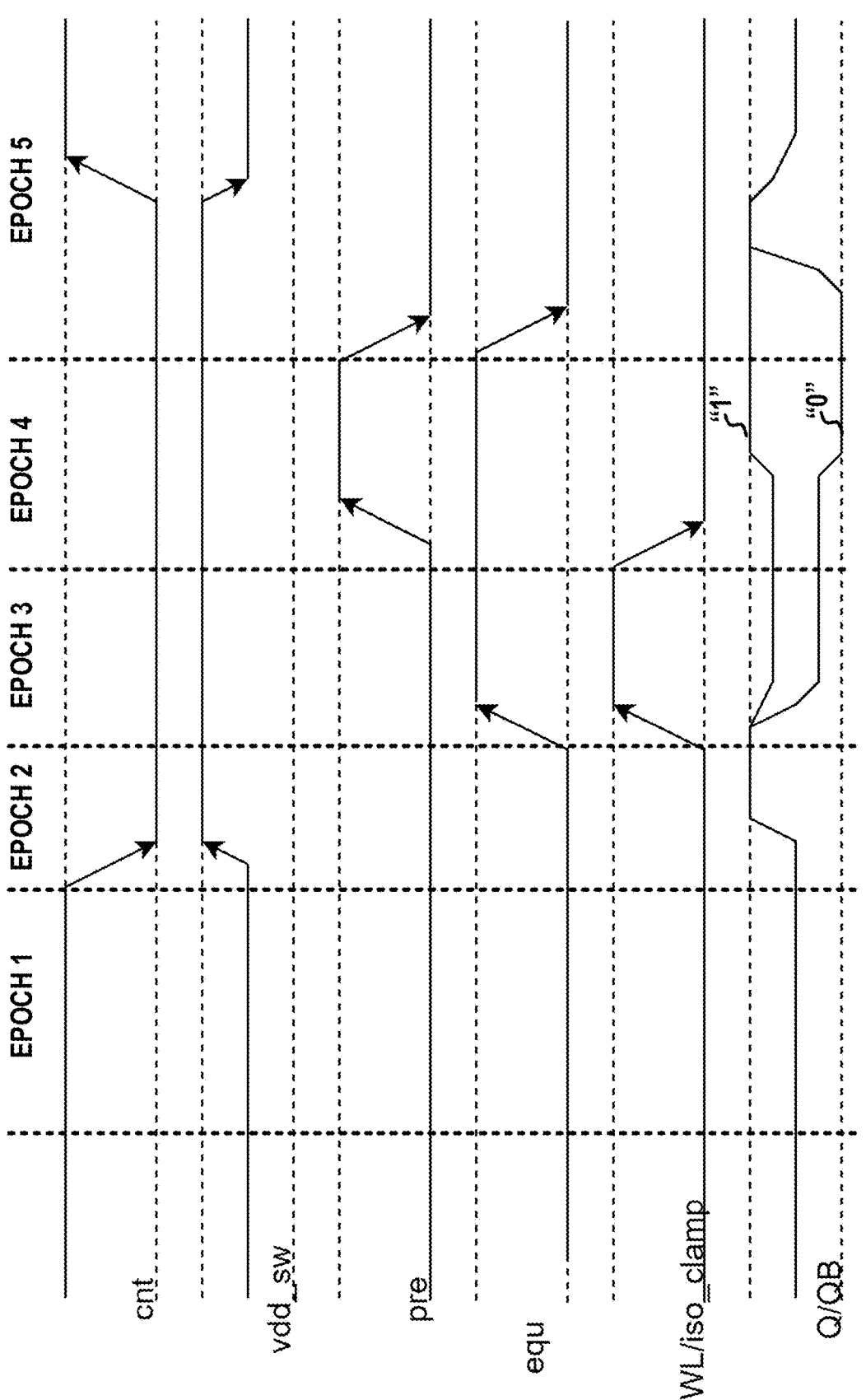
FIG. 4B is a graphical representation showing behavior of the differential sensing amplifier during a read cycle.

FIGS. 4A and 4B show one example implementation of the memory unit 100 for performing a "read" operation of the first memory cell 110A and the second memory cell 110B within the memory array 102. While the below section discusses the "read" operation in terms of the differential sensing amplifier 150 example presented in FIG. 4A, note that other configurations of the differential sensing amplifier 150 may be possible.

Differential Sensing Amplifier Structure

As shown in FIG. 4A, the first memory cell 110A includes the first MTJ device 112A in electrical communication with a first access transistor 116A and the second memory cell 110B includes the second MTJ device 112B in electrical communication with a second access transistor 116B. The first memory cell 110A and the second memory cell 110B are both in electrical association with a word line 122 and a source line 124 such that activation of the word line 122 activates the first access transistor 116A and the second access transistor 116B, thereby enabling passage of the reference current $I_{REF}$ across the first memory cell 110A and the second memory cell 110B for the read operation. The first memory cell 110A is associated with a first bit line 126A and the second memory cell 110B is associated with a second bit line 126B that each connect to the differential sensing amplifier 150 through the multiplexer 130. In particular, the multiplexer 130 can be split into more than one multiplexer 130 including a first multiplexer 130A and a second multiplexer 130B as shown in the example implementation of FIG. 4A. For instance, in the example shown, for a memory array 102 having n bit lines, the first multiplexer 130A can be associated with a first grouping of (n/2)-1 bit lines and the second multiplexer 130B can be associated with a second grouping of (n/2)-1 bit lines. In the example shown, the first bit line 126A is denoted as BL[0] and the second bit line 126B is denoted as BL[n], although it should be noted that any combination of two bit lines from BL[0] to BL[n] can be used as the first bit line 126A and the second bit line 126B, depending on the specific configuration of the memory unit 100 for different end-use cases.

Following selection of the first bit line 126A and the second bit line 126B at the multiplexer 130, the logic values stored within the first memory cell 110A and the second memory cell 110B can be read using the differential sensing amplifier 150. As shown, the differential sensing amplifier 150 is configured to generate the reference current $I_{REF}$ that is eventually applied to the first memory cell 110A and the second memory cell 110B, where application of the reference current $I_{REF}$ yields a first output voltage Q associated with the first memory cell 110A and a second output voltage $Q_B$ associated with the second memory cell 110B. The differential sensing amplifier 150 can include an outer network 160 and an inner network 170 that collectively generate the reference current $I_{REF}$ and read the first output voltage Q and the second output voltage $Q_B$.

Inputs to the differential sensing amplifier 150 can include an input voltage line VDD_SW, a precharge line PRE, an equalizer line EQU, and a clamping line ISO_CLAMP. In some embodiments, a voltage value of the input voltage line VDD_SW can be dictated by a control line CNT such that when the control line CNT exhibits a logic "LO" voltage value, the input voltage line VDD_SW is pulled up to match an input voltage line VDD and when the control line CNT exhibits a logic "HI" voltage value, the input voltage line VDD_SW is undriven or deselected. Outputs of the differential sensing amplifier 150 can include the first output voltage Q and the second output voltage $Q_B$. FIG. 4B and the corresponding discussion in a below section are presented to show the behaviors of the first output voltage Q and the second output voltage $Q_B$ with respect to the inputs and the logic values held within the first memory cell 110A and the second memory cell 110B during the read operation.

The outer network 160 can include a first PMOS transistor P1 in communication with the input voltage line VDD_SW that generates a first reference current $I_{REF\_1}$ that "flows" from the input voltage line VDD_SW, through a first NMOS transistor N1, and up through the first multiplexer 130A, where the first reference current $I_{REF\_1}$ can be applied at the first memory cell 110A. Similarly, the outer network 160 can include a second PMOS transistor P2 in communication with the VDD_SW line that generates a second reference current $I_{REF\_2}$ that "flows" from the VDD_SW line, through a second NMOS transistor N2, and up through the second multiplexer 130B, where the second reference current $I_{REF\_2}$ can be applied at the second memory cell 110B. The first reference current $I_{REF\_1}$ and the second reference current $I_{REF\_2}$ are equal, and are connected through a third PMOS transistor P3 of the outer network 160. The first PMOS transistor P1 and the second PMOS transistor P2 connected to the precharge line PRE at their gate terminals such that when the precharge line PRE is at a logic "LO" value, current is allowed to flow through the first PMOS transistor P1 and the second PMOS transistor P2. The equalizer line EQU is tied to the gate of the third PMOS transistor P3, which ensures that 0 and $Q_B$ are biased equally eliminating any mismatch at the beginning of the read operation. The first NMOS transistor N1 and the second NMOS transistor N2 are both connected to the clamping line ISO_CLAMP at their gate terminals such that when the clamping line ISO_CLAMP is at a logic "HI" value, current is allowed to flow from the outer network 160 and/or the inner network 170 to the first memory cell 110A and the second memory cell 110B.

The inner network 170 can include a first CMOS pairing 172A associated with the first memory cell 110A and a second CMOS pairing 172B associated with the second memory cell 110B. The inner network 170 can also include a third NMOS transistor N3 whose gate terminal is connected to the precharge line PRE that ties the first CMOS pairing 172A and the second CMOS pairing 172B to "ground" when the precharge line PRE is at a logic "HI" value.

The first CMOS pairing 172A includes a fourth PMOS transistor P4 and a fourth NMOS transistor N4, where the fourth PMOS transistor P4 is connected between the input voltage line VDD_SW and the fourth NMOS transistor N4, and where the fourth NMOS transistor N4 is connected between the fourth PMOS transistor P4 and the third NMOS transistor N3 as shown. The first output voltage Q is taken between the fourth PMOS transistor P4 and the fourth NMOS transistor N4. Likewise, the second CMOS pairing 172B includes a fifth PMOS transistor P5 and a fifth NMOS transistor N5, where the fifth PMOS transistor P5 is connected between the input voltage line VDD_SW and the fifth NMOS transistor N5, and where the fifth NMOS transistor N5 is connected between the fifth PMOS transistor P5 and the third NMOS transistor N5 as shown. The second output voltage $Q_B$ is taken between the fifth PMOS transistor P5 and the fifth NMOS transistor N5.

As shown, the gate terminals of the fourth PMOS transistor P4 and the fourth NMOS transistor N4 of the first CMOS pairing 172A are connected to the second output voltage $Q_B$; similarly, the gate terminals of the fifth PMOS transistor P5 and the fifth NMOS transistor N5 of the second CMOS pairing 172B are connected to the second output voltage $Q_B$.

Read Sequence and Resultant Behavior

With additional reference to FIG. 4B, a read operation cycle is shown for reading the logic values stored within the first memory cell 110A and the second memory cell 110B using the first output voltage Q (associated with the first memory cell 110A) and the second output voltage $Q_B$ (associated with the second memory cell 110B). The "read" operation cycle can be divided into five epochs and is controlled through the following inputs: the control line CNT, the precharge line PRE, the equalizer line EQU and the clamping line ISO_CLAMP which correlates with the word line WL at the memory array 102. As shown, the input voltage line VDD_SW can be inversely related to the control line CNT.

During Epoch 1, the control line CNT is "HI"; as a result, the input voltage line VDD_SW is undriven/tristated. The precharge line PRE, the clamping line ISO_CLAMP and word line WL are "LO"; as a result, the first output voltage Q and the second output voltage $Q_B$ are not yet reflective of the logic values stored within the first memory cell 110A and the second memory cell 110B. The first PMOS transistor P1 and the second PMOS transistor P2 are activated and the third NMOS transistor N3 is deactivated because of their connections to the precharge line PRE. Similarly, the third PMOS transistor P3 is activated due to its connection to the equalizer line EQU, and serves to equalize Q and $Q_B$. The first NMOS transistor N1 and the second NMOS transistor N2 are both deactivated because of their connections to the clamping line ISO_CLAMP, as well as the first access transistor 116A of the first memory cell 110A and the second access transistor 116B of the second memory cell 110B because of their connections to the word line WL, preventing current from flowing from the first output voltage Q and the second output voltage $Q_B$ to the first memory cell 110A and the second memory cell 110B.

During Epoch 2, the control line CNT turns "LO", pulling the input voltage line VDD_SW "HI". Because the precharge line PRE and equalizer line EQU are still "LO", the first PMOS transistor P1, the second PMOS transistor P2 and the third PMOS transistor P3 are activated and the third NMOS transistor N3 are deactivated, connecting the input voltage line VDD_SW with the first output voltage Q and the second output voltage $Q_B$, initially pulling the first output voltage Q and the second output voltage $Q_B$ up to a logic "HI" voltage value. Recall that the first NMOS transistor N1, the second NMOS transistor N2, the first access transistor 116A and the second access transistor 116B are still deactivated due to their connections with the clamping line ISO_CLAMP and the word line WL, preventing current from flowing from the first output voltage Q and the second output voltage $Q_B$ to the first memory cell 110A and the second memory cell 110B. During this stage, the first output voltage Q and the second output voltage $Q_B$ are both pulled "HI" when connected to the input voltage line VDD_SW; note that the fourth NMOS transistor N4 and the fifth NMOS transistor N5 activate and the fourth PMOS transistor P4 and the fifth PMOS transistor P5 deactivate due to their connections with the first output voltage Q and the second output voltage $Q_B$.

During Epoch 3, the control line CNT is still "LO", as such, the input voltage line VDD_SW is still "HI". Because the precharge line PRE is still "LO", the first PMOS transistor P1 and the second PMOS transistor P2 are activated and the third NMOS transistor N3 is deactivated, maintaining the connection between the input voltage line VDD_SW, the first output voltage Q and the second output voltage $Q_B$. However, the equalizer line EQU, the clamping line ISO_CLAMP and word line WL are all turned "HI"; the clamping line ISO_CLAMP and word line WL select the relevant memory cells to be read (e.g., the first memory cell 110A and the second memory cell 110B), activating the first NMOS transistor N1, the second NMOS transistor N2, the first access transistor 116A and the second access transistor 116B due to their connections with the clamping line ISO_CLAMP and the word line WL. The equalizer line EQU, being "HI", deactivates the third PMOS transistor P3, isolating the first output voltage Q and the second output voltage $Q_B$. This new path allows the first and second reference currents $I_{REF\_1}$ and $I_{REF\_2}$ (collectively, $I_{REF}$) to flow from the first output voltage Q and the second output voltage $Q_B$, through the first memory cell 110A and the second memory cell 1108, and through towards VSS (through the "select" line SL) (where "VSS" denotes "ground" or "neutral"). This connection with VSS causes the first output voltage Q and the second output voltage $Q_B$ to drop; because the first memory cell 110A has the first resistance value within the "high" resistance range $R_H$ and the second memory cell 1108 has the minimal resistance value within the "minimal" resistance range $R_o$, the first output voltage drops considerably less than the second output voltage $Q_B$, which has a less obstructed path to VSS. Note that by the end of Epoch 3, the value of the first output voltage Q is still less than a solid "HI" voltage value and the value of the second output voltage $Q_B$ is still greater than a solid "LO" voltage value.

During Epoch 4, the control line CNT is still "LO", as such, the input voltage line VDD_SW is still "HI". The clamping line ISO_CLAMP and word line WL are both turned "LO" again to isolate the first output voltage Q and the second output voltage $Q_B$, deactivating the first NMOS transistor N1, the second NMOS transistor N2, the first access transistor 116A and the second access transistor 116B due to their connections with the clamping line ISO_CLAMP and the word line WL and severing the path between the first output voltage Q and the first memory cell 110A and severing the path between the second output voltage $Q_B$ and the second memory cell 1108. During this stage, the precharge line PRE is turned "HI", deactivating the first PMOS transistor P1 and the second PMOS transistor P2 and activating the third NMOS transistor N3. Turning the precharge line PRE "HI" severs the connection between the input voltage line VDD_SW, the first output voltage and the second output voltage $Q_B$, allowing the third NMOS transistor N3 to connect the differential sensing amplifier 150 to VSS. Because the first output voltage Q is close to a "HI" voltage value, the fifth NMOS transistor N5 of the second CMOS pairing 172B activates and pulls the second output voltage $Q_B$ down to a hard logic "LO" value. Simultaneously, because the second output voltage $Q_B$ is close to a "LO" voltage value, the fourth PMOS transistor P5 of the first CMOS pairing 172A activates and pulls the first output voltage Q up to a hard logic "HI" value. At the end of Epoch 4, the first output voltage Q is reflective of the logic "HI"

value stored at the first memory cell 110A and the second output voltage $Q_B$ is reflective of the logic "LO" value stored at the second memory cell 110B.

During the final Epoch 5, the precharge line PRE and the equalizer line EQU are turned "LO" again, and the control line CNT is turned "HI" again; as such, the input voltage line VDD_SW is tristated/unselected, allowing the first output voltage Q and the second output voltage $Q_B$ to settle back to a tristate value. The cycle can start again at Epoch 1, where a new word line WL may be chosen that selects new memory cell pairs from the memory array 102 for reading.

Multi-Bit Option

Figures 5A, 5B, 5C:
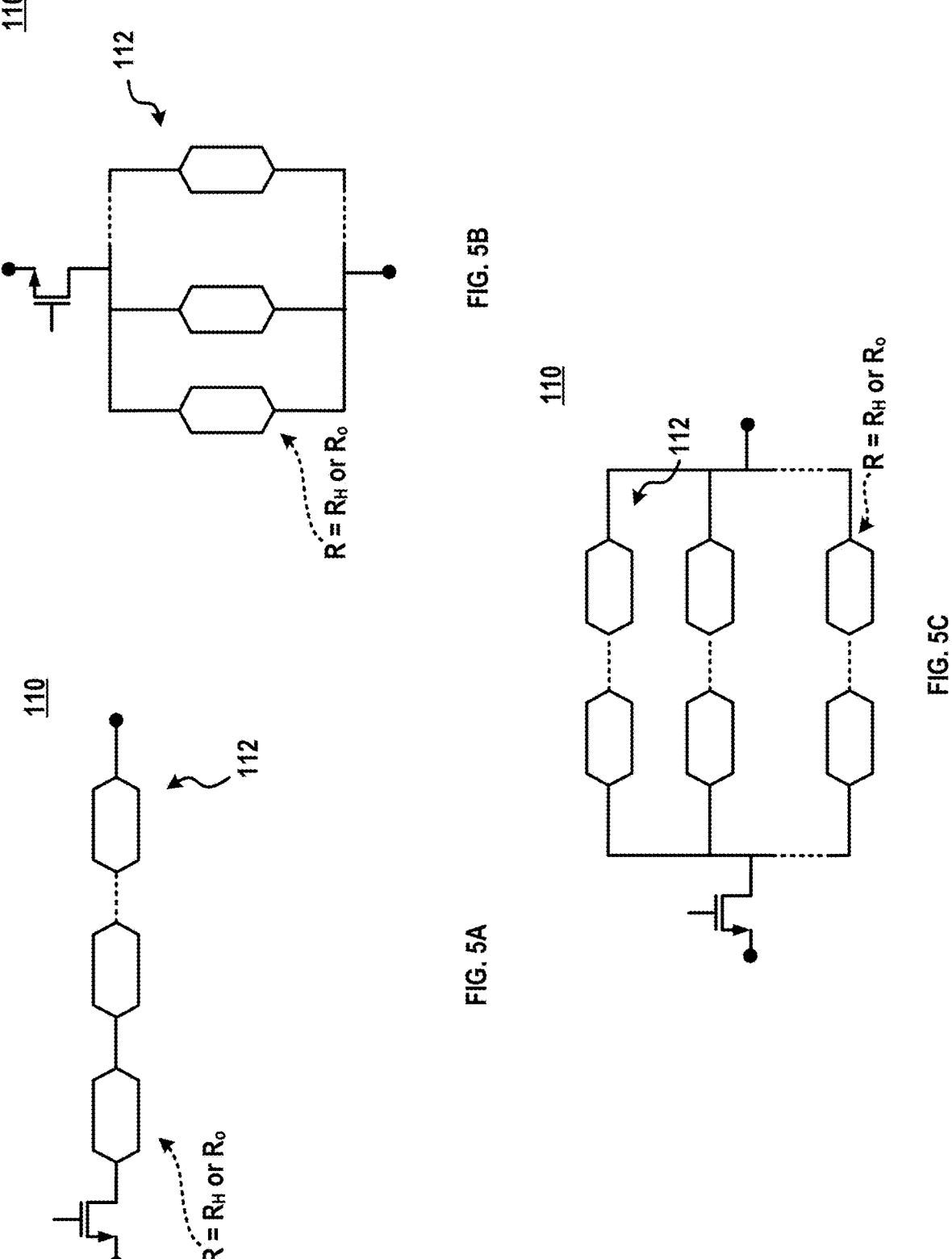
FIGS. 5A-5C are a series of schematic diagrams showing multi-bit MRAM cells employing the shorted MTJ device of FIG. 2B and the MTJ device of FIG. 1A

In some embodiments shown in FIGS. 5A-5C, the memory unit 100 can be extended to hold more than one bit (e.g., where single MTJ can be replaced with stack of 'n' MTJs in series). As such, the memory cell 110 can include n MTJ devices 112 in series with one another whose values are fixed to modulate and/or secure a total resistance value of the memory cell 110. In particular, a memory cell 110 can have n MTJ devices 112 connected in series (FIG. 5A), parallel (FIG. 5B), and/or a combination of series and parallel connections (FIG. 5C), where each MTJ device 112 of the n MTJ devices 112 exhibit high resistance values within the first high resistance range $R_H$ or minimal resistance values within the second minimal resistance range $R_o$. For instance, a memory cell 110 having n MTJ devices 112 can exhibit a target total resistance value $R_{target}$ by combining one or more MTJ devices 112 having high resistance values within the first high resistance range $R_H$ and/or one or more MTJ devices 112 having minimal resistance values within second minimal resistance range $R_o$ such that a total resistance value of the memory cell 110 meets the target total resistance value $R_{target}$. The memory cell 110 can be programmed such that collectively, the n MTJ devices 112 permanently exhibit the target total resistance value $R_{target}$ due to the combination of n MTJ devices 112 that are permanently fixed such that they exhibit high resistance values within the first high resistance range $R_H$ and/or minimal resistance values within second minimal resistance range $R_o$.

Methods

Figure 7:
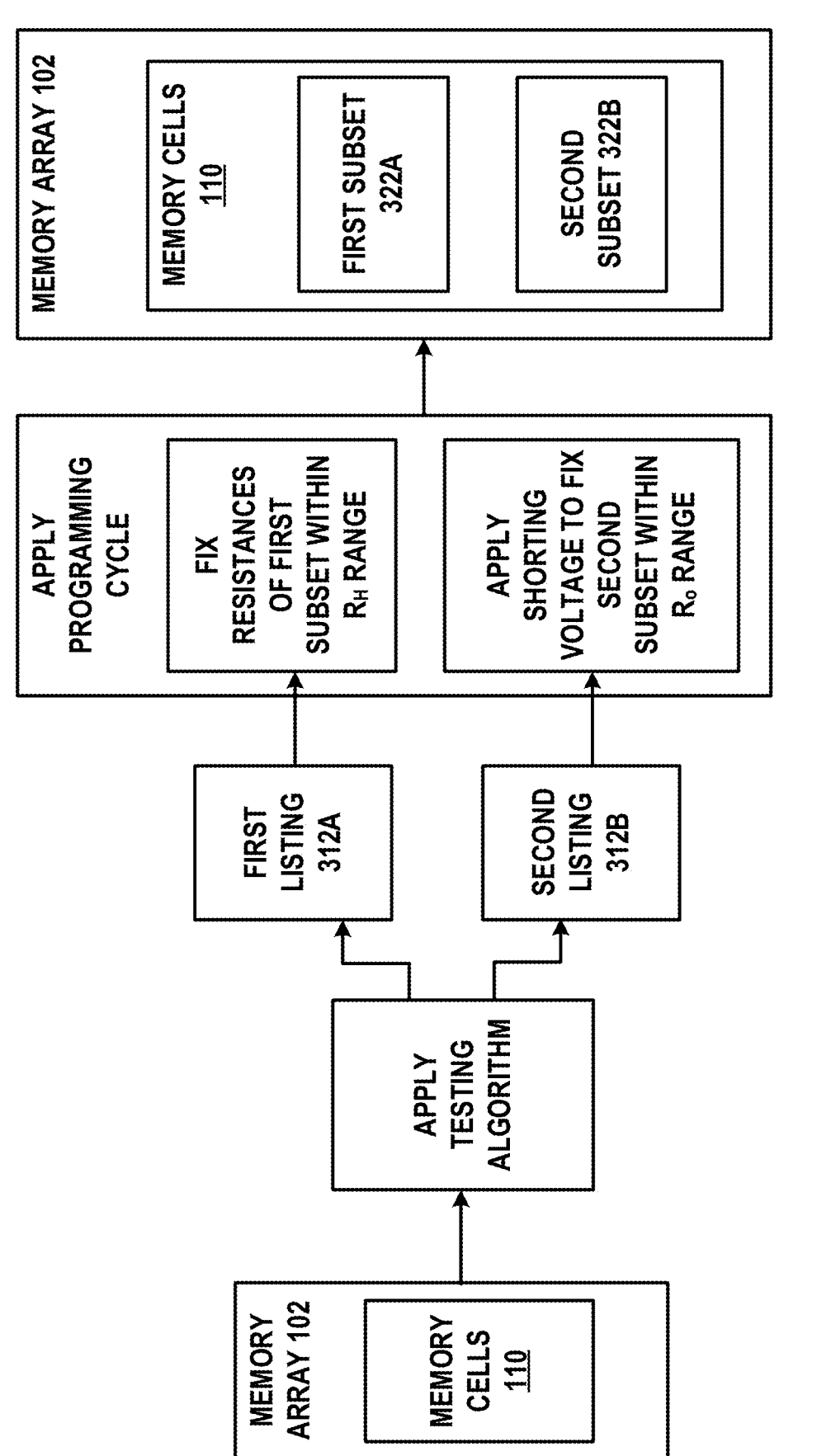
FIG. 7 is a simplified schematic diagram illustrating aspects of the method of FIG. 6.

A method 200 for increasing a read margin in pre-programmed memory arrays is presented in FIG. 6 with a supplementary figure provided in FIG. 7. Block 210 of method 200 includes providing the memory array 102 having the plurality of memory cells 110, where the memory cells 110 are to be configured for read-only operations. Block 220 includes determining a first subset of memory cells 322A of the plurality of memory cells 110 to be programmed such that they permanently exhibit a first logic value, where the first logic value is a logic "HI" value. Similarly, block 230 includes determining a second subset of memory cells 322B of the plurality of memory cells 110 to be programmed such that they permanently exhibit a second logic value, where the second logic value is a logic "LO" value. Blocks 220 and 230 can be accomplished by applying a testing algorithm to the memory array 102 yielding a first listing of memory cells 312A to be included within the first subset of memory cells 322A and a second listing of memory cells 312B to be included within the second subset of memory cells 322B. During testing, the plurality of memory cells 110 can be temporarily configured to exhibit a first resistance value within the first high-resistance range $R_H$ or a third resistance value within the third low-resistance range $R_L$ to allow re-configuration of the memory array 102 when determining which memory cells of the memory array 102 belong within the second subset of memory cells 322B.

After the first listing of memory cells 312A and the second listing of memory cells 312B are decided upon, block 240 includes configuring each memory cell 110 of the first subset of memory cells 322A such that each respective memory cell 110 of the first subset of memory cells 322A exhibits a first resistance value within a first high-resistance range R<sub>H</sub>. Block 250 includes applying a shorting voltage or current having a voltage value within a shorting voltage or current range to each memory cell 110 of the second subset of memory cells 322B such that each respective memory cell 110 of the second subset of memory cells 322B exhibits a second resistance value within a second minimal-resistance range R<sub>o</sub>. This can be accomplished through a programming cycle to the memory array 102 that applies the shorting voltage or current to each memory cell 110 of the second subset of memory cells 322B such that each respective memory cell 110 of the second subset of memory cells 322B exhibits a second resistance value within the second minimal-resistance range R<sub>o</sub>.

Block 260 includes configuring the multiplexer 130 of the memory array 102 to pair each memory cell 110 of the first subset of memory cells 322A with a respective memory cell 110 of the second subset of memory cells 322B. To allow reading of the memory array 102, block 270 includes providing the differential sensing amplifier 150 in electrical communication with the first subset of memory cells 322A and the second subset of memory cells 322B, where the sensing amplifier 150 is configured to read a logic value exhibited by a first memory cell (e.g., the first memory cell 110A) of the first subset of memory cells 322A or a second memory cell (e.g., the second memory cell 110B) of the second subset of memory cells 322B by amplification of a differential voltage associated with a difference between a first resistance value of the first memory cell and a second resistance value of the second memory cell.

It should be understood from the foregoing that, while particular embodiments have been illustrated and described, various modifications can be made thereto without departing from the spirit and scope of the invention as will be apparent to those skilled in the art. Such changes and modifications are within the scope and teachings of this invention as defined in the claims appended hereto.

What is claimed is:

1. A memory unit, comprising:
a first memory cell of a read-only memory array including a first magnetic tunnel junction device having a fixed layer, a free layer, and a barrier layer positioned between the fixed layer and the free layer, the free layer having an antiparallel magnetic dipole orientation relative to the fixed layer such that the first memory cell exhibits a first resistance value and stores a first logic value;
a second memory cell of the read-only memory array including a second magnetic tunnel junction device having a fixed layer, a free layer, and a barrier layer positioned between the fixed layer and the free layer, wherein the barrier layer of the second magnetic tunnel junction device is shorted such that the second memory cell permanently exhibits a second resistance value and maintains a second logic value;
a first plurality of bit lines, the first plurality of bit lines including a first bit line coupled to the first memory cell;
a second plurality of bit lines, the second plurality of bit lines including a second bit line coupled to the second memory cell; and a multiplexer in communication with a differential sensing amplifier, the multiplexer being configured to selectively establish electrical communication between a selected one of the first plurality of bit lines and a first input node of the differential sensing amplifier and between a selected one of the second plurality of bit lines and a second input node of the differential sensing amplifier and, during a read operation of a selected bit value of the read-only memory array, to (i) selectively couple the first bit line from the first plurality of bit lines to the first input node and (ii) selectively couple the second bit line from the second plurality of bit lines to the second input node such that the first memory cell and the second memory cell together form a complementary cell pair that stores a single bit value of a read-only memory array, and the differential sensing amplifier being configured to:
bias the complementary cell pair such that a first output voltage at the first input node depends on the first resistance value and a second output voltage at the second input node depends on the second resistance value; and
measure a differential voltage value between the first output voltage and the second output voltage, wherein the barrier layer of the second magnetic tunnel junction device being shorted and the free layer of the first magnetic tunnel junction device having the antiparallel magnetic dipole orientation relative to the fixed layer such that the first resistance value is greater than the second resistance value results in maximization of the differential voltage value during the read operation.

2. The memory unit of claim 1, wherein the second magnetic tunnel junction device of the second memory cell is shorted by application of a shorting voltage or current having a value within a shorting voltage or current range across the free layer and the fixed layer.

3. The memory unit of claim 1, the first memory cell further comprising:
a first access transistor including a first drain contact, a first source contact, and a first gate contact, wherein the first source contact is in electrical communication with a source line and wherein the first gate contact is in electrical communication with a word line;
wherein the fixed layer of the first magnetic tunnel junction device is in electrical communication with the first drain contact of the first access transistor and the free layer of the first magnetic tunnel junction device is in electrical communication with the first bit line.

4. The memory unit of claim 1, the second memory cell further comprising:
a second access transistor including a second drain contact, a second source contact, and a second gate contact, wherein the second source contact is in electrical communication with a source line and wherein the second gate contact is in electrical communication with a word line;
wherein the fixed layer of the second magnetic tunnel junction device of the second memory cell is in electrical communication with the second drain contact of the second access transistor and the free layer of the second magnetic tunnel junction device of the second memory cell is in electrical communication with the second bit line.

5. The memory unit of claim 1, wherein the first memory cell or the second memory cell further includes a third magnetic tunnel junction device connected in series or in parallel with the first magnetic tunnel junction device such that the first memory cell or the second memory cell exhibits a target total resistance value $R_{target}$.

6. A method, comprising:
configuring a read-only memory array and a multiplexer in communication with a differential sensing amplifier, the read-only memory array including a first subset of memory cells including a first memory cell storing a first logic value and a second subset of memory cells including a second memory cell storing a second logic value, the first memory cell including a first magnetic tunnel junction device having a fixed layer, a free layer, and a barrier layer positioned between the fixed layer and the free layer, the free layer having an antiparallel magnetic dipole orientation relative to the fixed layer such that the first memory cell exhibits a first resistance value and stores the first logic value, the configuring further comprising:
configuring the read-only memory array to include a first plurality of bit lines and a second plurality of bit lines, the first plurality of bit lines including a first bit line coupled to the first memory cell and the second plurality of bit lines including a second bit line coupled to the second memory cell, and
configuring the multiplexer to: (i) selectively establish electrical communication between a selected one of the first plurality of bit lines and a first input node of the differential sensing amplifier, and between a selected one of the second plurality of bit lines and a second input node of the differential sensing amplifier and, (ii) during a read operation of a selected bit value of the read-only memory array, to selectively couple the first bit line from the first plurality of bit lines to the first input node and the second bit line from the second plurality of bit lines to the second input node such that the first memory cell and the second memory cell together form a complementary cell pair that stores a single bit value of the read-only memory array; and
applying a shorting voltage or current to the second memory cell of the second subset of memory cells of the read-only memory array, the second memory cell including a second magnetic tunnel junction device having a fixed layer, a free layer, and a barrier layer positioned between the fixed layer and the free layer, wherein the barrier layer of the second magnetic tunnel junction device is shorted such that the second memory cell permanently exhibits a second resistance value and maintains the second logic value;
wherein the barrier layer of the second magnetic tunnel junction device being shorted and the free layer of the first magnetic tunnel junction device having the antiparallel magnetic dipole orientation relative to the fixed layer such that the first resistance value is greater than the second resistance value results in maximization of a differential voltage value between the first memory cell and the second memory cell during the read operation.

7. The method of claim 6, further comprising:
configuring the multiplexer to pair each memory cell of the first subset of memory cells with a respective memory cell of the second subset of memory cells.

8. The method of claim 6,
wherein the differential sensing amplifier is in electrical communication with the first memory cell of the first subset of memory cells and the second memory cell of the second subset of memory cells, the differential sensing amplifier being configured to read a logic value exhibited by the first memory cell or the second memory cell by amplification of a differential voltage associated with a difference between the first resistance value of the first memory cell and the second resistance value of the second memory cell.

9. The method of claim 6, further comprising:
applying, by the differential sensing amplifier, a reference current to the first memory cell and the second memory cell that results in a first output voltage associated with the first memory cell and a second output voltage associated with the second memory cell, wherein the first output voltage correlates with the first resistance value held by the first memory cell and wherein the second output voltage correlates with the second resistance value held by the second memory cell.

10. The method of claim 6, further comprising:
applying a testing algorithm to the read-only memory array yielding a first listing of memory cells to be included within the first subset of memory cells and a second listing of memory cells to be included within the second subset of memory cells.

11. The method of claim 10, further comprising:
applying, during testing of the read-only memory array, a second current to the second subset of memory cells to initially configure the magnetic dipole orientation of the free layer of the second memory cell in a parallel direction with the magnetic dipole orientation of the fixed layer such that the second memory cell stores the second logic value prior to application of the shorting voltage or current to the second memory cell.

12. The method of claim 6, wherein the first memory cell or the second memory cell further includes a third magnetic tunnel junction device connected in series or in parallel with the first magnetic tunnel junction device or the second magnetic tunnel junction device such that the first memory cell or the second memory cell exhibits a target total resistance value $R_{target}$.

13. The method of claim 6, further comprising:
applying a first current to the first subset of memory cells to store the first logic value at the first memory cell, the first memory cell including a first magnetic tunnel junction device having a fixed layer, a free layer, and a barrier layer positioned between the fixed layer and the free layer, the free layer having an antiparallel magnetic dipole orientation relative to the fixed layer such that the first memory cell exhibits the first resistance value and stores the first logic value.

14. A memory system comprising:
a read-only memory array, including:
a first group of memory cells, each comprising a magnetic tunnel junction (MTJ) having an antiparallel magnetic dipole orientation and exhibiting a first resistance value;
a second group of memory cells, each comprising an MTJ having a shorted barrier layer and exhibiting a second resistance value that is less than the first resistance value;
a first plurality of bit lines, the first plurality of bit lines including a first bit line coupled to a first memory cell of a complementary cell pair, the first memory cell being a member of the first group of memory cells; and
a second plurality of bit lines, the second plurality of bit lines including a second bit line coupled to a second memory cell of the complementary cell pair, the second memory cell being a member of the second group of memory cells;

a differential sensing circuit including a differential sensing amplifier having a first input node and a second input node; and a mapping circuit including a first multiplexer configured to selectively couple a bit line of the first plurality of bit lines with the first input node of the differential sensing circuit, and a second multiplexer configured to selectively couple a bit line of the second plurality of bit lines with the second input node of the differential sensing circuit, the mapping circuit being further configured to associate respective memory cells of the first group of memory cells with corresponding memory cells of the second group of memory cells as complementary cell pairs, each respective complementary cell pair collectively storing a single bit value of the read-only memory array; and the differential sensing circuit configured to, for each complementary cell pair, bias the complementary cell pair via the first multiplexer and the second multiplexer such that a first signal at the first input node depends on the first resistance value and a second signal at the second input node depends on the second resistance value and to generate the bit value based on a comparison of a differential signal between the first and second signals with a reference current, wherein the antiparallel magnetic dipole orientation of the first group of memory cells and the shorted barrier layer of the second group of memory cells maximizes a magnitude of the differential signal relative to the reference current.

* * * * *